(12) United States Patent
Nakamura et al.

(10) Patent No.: US 7,413,718 B2
(45) Date of Patent: Aug. 19, 2008

(54) REACTION APPARATUS FOR PRODUCING SILICON

(75) Inventors: Yasuo Nakamura, Shunan (JP); Satoru Wakamatsu, Shunan (JP)

(73) Assignee: Tokuyama Corporation (JP)

( * ) Notice: Subject to any disclaimer, the term of this patent is extended or adjusted under 35 U.S.C. 154(b) by 498 days.

(21) Appl. No.: 10/518,197

(22) PCT Filed: Jun. 17, 2003

(86) PCT No.: PCT/JP03/07657

§ 371 (c)(1),
(2), (4) Date: Dec. 16, 2004

(87) PCT Pub. No.: WO03/106338

PCT Pub. Date: Dec. 24, 2003

(65) Prior Publication Data

US 2005/0201908 A1   Sep. 15, 2005

(30) Foreign Application Priority Data

Jun. 18, 2002   (JP) ............................. 2002-176653

(51) Int. Cl.
*B01J 19/00*   (2006.01)
*A62D 3/00*   (2007.01)

(52) U.S. Cl. ...................... 422/198; 422/199; 117/200; 117/204; 423/350

(58) Field of Classification Search ................ 422/198, 422/199

See application file for complete search history.

(56) References Cited

U.S. PATENT DOCUMENTS

| 4,176,166 A | 11/1979 | Carman |
| 4,265,859 A * | 5/1981 | Jewett ......................... 422/199 |
| 4,737,348 A * | 4/1988 | Levin .......................... 422/199 |
| 2002/0104474 A1 | 8/2002 | Wakamatsu et al. |

FOREIGN PATENT DOCUMENTS

| JP | 59-121109 A | 7/1984 |
| JP | 11-314996 A | 11/1999 |
| JP | 2002-029726 A | 1/2002 |

* cited by examiner

*Primary Examiner*—Walter D. Griffin
*Assistant Examiner*—Lessanework T Seifu
(74) *Attorney, Agent, or Firm*—The Webb Law Firm, P.C.

(57) ABSTRACT

A silicon production reactor including a reaction vessel and heating element, the reaction vessel has a vertically extending wall and a space surrounded by the wall, the heating element being capable of heating at least a part, including lower end portion, of the wall's surface facing the space to a temperature of not lower than the melting point of silicon, the silicon production reactor being adapted to flow raw gas for silicon deposition from an upper part of the space of the reaction vessel toward a lower part thereof, characterized in that the space of the reaction vessel is of slit form in cross-sectional view. This silicon production reactor is capable of attaining improvement with respect to problems encountered at apparatus scale-up, such as decrease of reactivity of raw gas and generation of by-products, thereby accomplishing a striking enhancement of production efficiency.

7 Claims, 6 Drawing Sheets

REACTION APPARATUS FOR PRODUCING SILICON

The present invention relates to a novel silicon production reactor. More particularly, the present invention relates to a silicon production reactor that in the industrial production of silicon continuously performed for a prolonged period of time, is capable of enhancing the reactivity of raw gas and capable of suppressing the generation of by-products to thereby maintain a high silicon yield and attain an enhancement of production efficiency.

BACKGROUND ART

In the art, various processes for producing silicon for use as a raw material for semiconductors and photocells are known. Some thereof are already put into industrial practice.

For example, one prior art process is known as the Siemens process. In the Siemens process, a silicon rod having been heated to a silicon deposition temperature by current passages is disposed in a bell jar, and trichlorosilane ($SiHCl_3$, hereinafter referred to as TCS) or monosilane ($SiH_4$) together with a reducing gas, such as hydrogen, is brought into contact with the heated silicon rod to thereby cause the deposition of silicon.

This process is characterized in that a high-purity silicon can be obtained, and carried out as the most common process. However, deposition is performed batchwise, so that there is such a problem that an extremely complex procedure including arranging of a silicon rod as seed, heating of the silicon rod by current passage, deposition, cooling, takeout, bell jar cleaning, etc. is inevitable.

With a view toward resolving this problem, Japanese Patent Laid-open Publication No. 2002-29726 proposes a silicon production reactor capable of producing silicon stably and continuously over a prolonged period of time. In this silicon production reactor, while feeding a raw gas for silicon deposition into a tubular vessel capable of being heated to a temperature of not lower than the melting point of silicon, the tubular vessel is heated so as to perform deposition of silicon. The deposited silicon is continuously melted and caused to fall from the lower end of the tubular vessel, thereby attaining collection of silicon.

This reactor is a very excellent apparatus capable of resolving various problems of the conventional Siemens process and capable of continuous production of silicon. However, when a scale-up of the reaction vessel of cylindrical configuration, etc. described in Examples of Japanese Patent Laid-open Publication No. 2002-29726 is preformed as it is with an intent to produce silicon on an industrial scale of hundreds of tons or more per year, the reactivity of raw gas would inevitably drop. Further, fine powder of silicon and by-products such as low-molecular-weight polymers of silane compounds are likely to be generated, thereby tending to invite a decrease of silicon yield. In these respects, an improvement has been demanded.

SUMMARY OF THE INVENTION

The inventors have made extensive and intensive studies with a view toward resolving the above problems. As a result, it has been found that in the above apparatus, the above problems are caused by the configuration in cross-sectional view of the inside face of the tubular vessel. That is, when a scale-up of a reactor wherein the inside face of the tubular vessel has the shape of simple circle, regular polygon or the like in cross-sectional view is carried out, there would be a space highly apart from the heated inside face of the tubular vessel, thereby inviting problems such as decrease of raw gas reactivity and tendency toward by-product formation. Studies have been conducted on the basis of this finding. As a result, it has been found that all the above problems can be solved by a reaction vessel comprising a vertically extending wall and a space surrounded by the wall wherein the space of the reaction vessel is of slit form in cross-sectional view so as to reduce the distance from the interior of the space to the wall's surface facing the space. In other words, the distance between the wall's surface where silicon deposition occurs and the interior space where raw gas therein barely contacts the wall's surface is reduced so as to increase reaction efficiency. The present invention has been completed on the basis of this finding.

Thus, according to the present invention, there is provided a silicon production reactor comprising a reaction vessel and heating means, said reaction vessel comprising a vertically extending wall and a space surrounded by the wall, said heating means being capable of heating at least a part, including lower end portion, of the wall's surface facing the space to a temperature of not lower than the melting point of silicon. The silicon production reactor is adapted to receive a raw gas for silicon deposition flowing from an upper part of the space of the reaction vessel toward a lower part thereof, characterized by the fact that the space within the reaction vessel is of slit form in cross-sectional view.

DETAILED DESCRIPTION OF THE INVENTION

The present invention will be described below with reference to appended drawings showing representative embodiments thereof, which however in no way limit the scope of the present invention.

Figure 1:
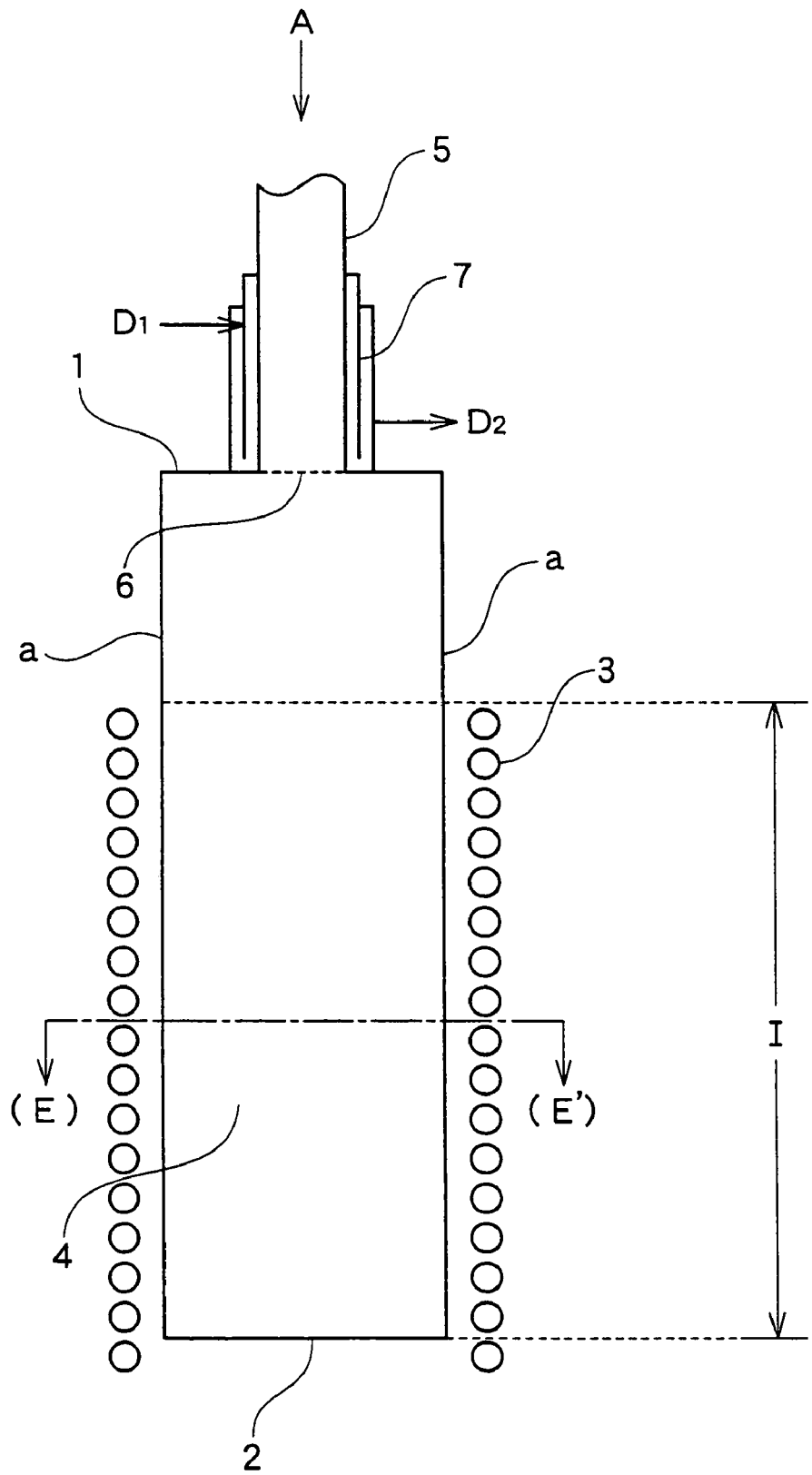
FIG. 1 is a schematic view of portion of a fundamental form of silicon production reactor according to the present invention, which view shows a vertical section of the reactor.
Figure 2:
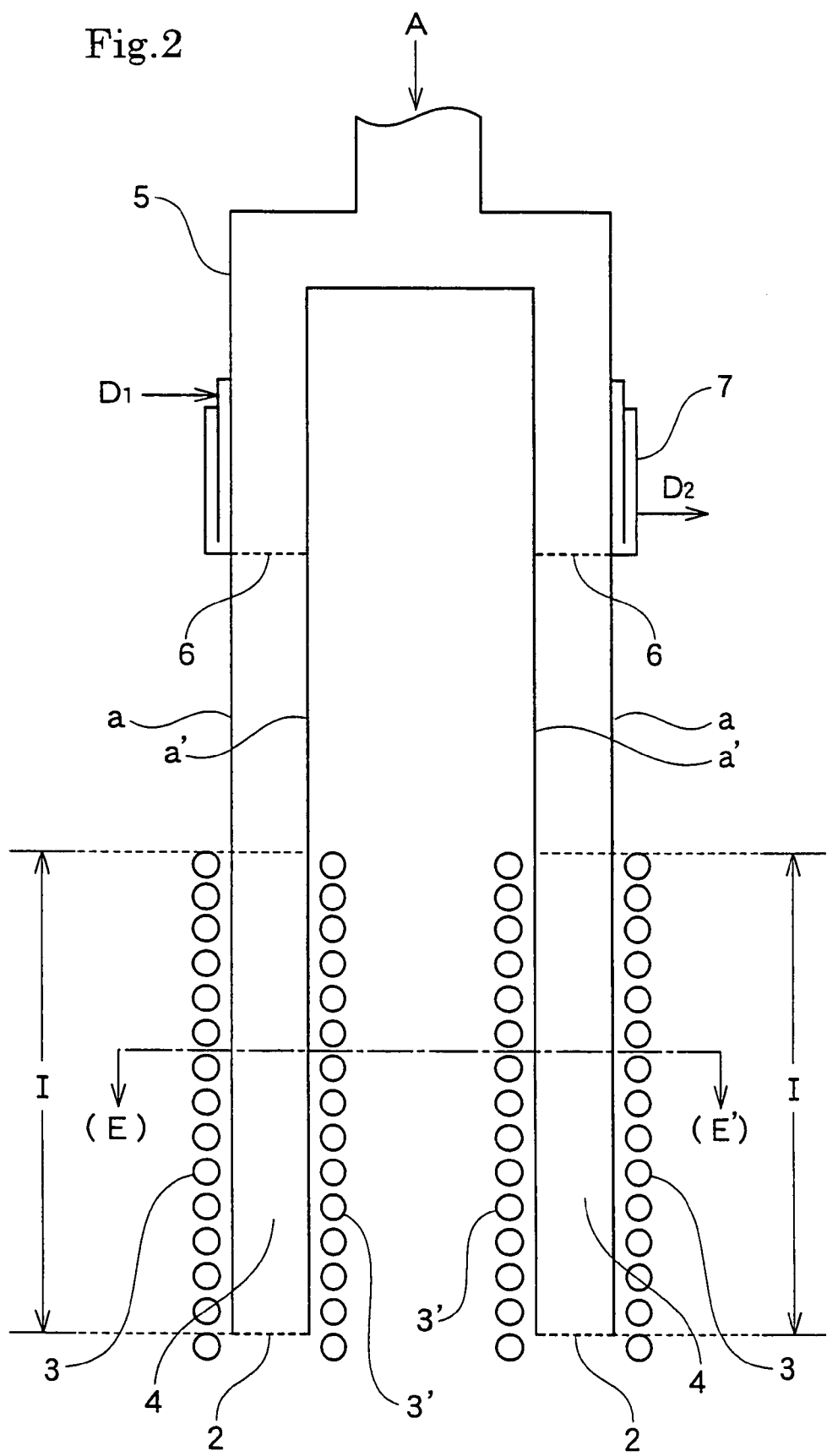
FIG. 2 is a schematic view of portion of another fundamental form of silicon production reactor according to the present invention, which view shows a vertical section of the reactor.
Figure 3:
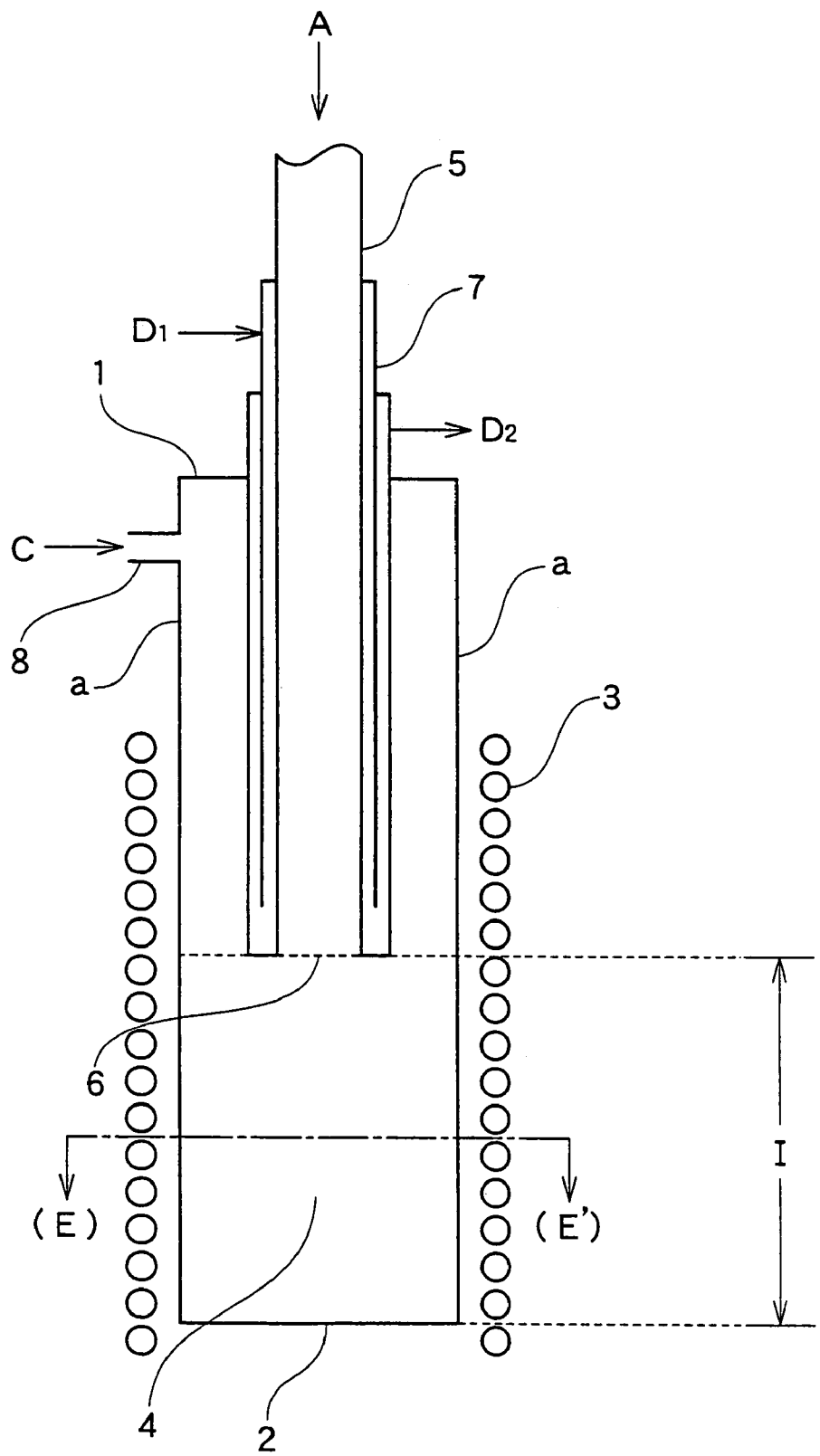
FIG. 3 is a schematic view of portion of a further fundamental form of silicon production reactor according to the present invention, which view shows a vertical section of the reactor.
Figure 4:
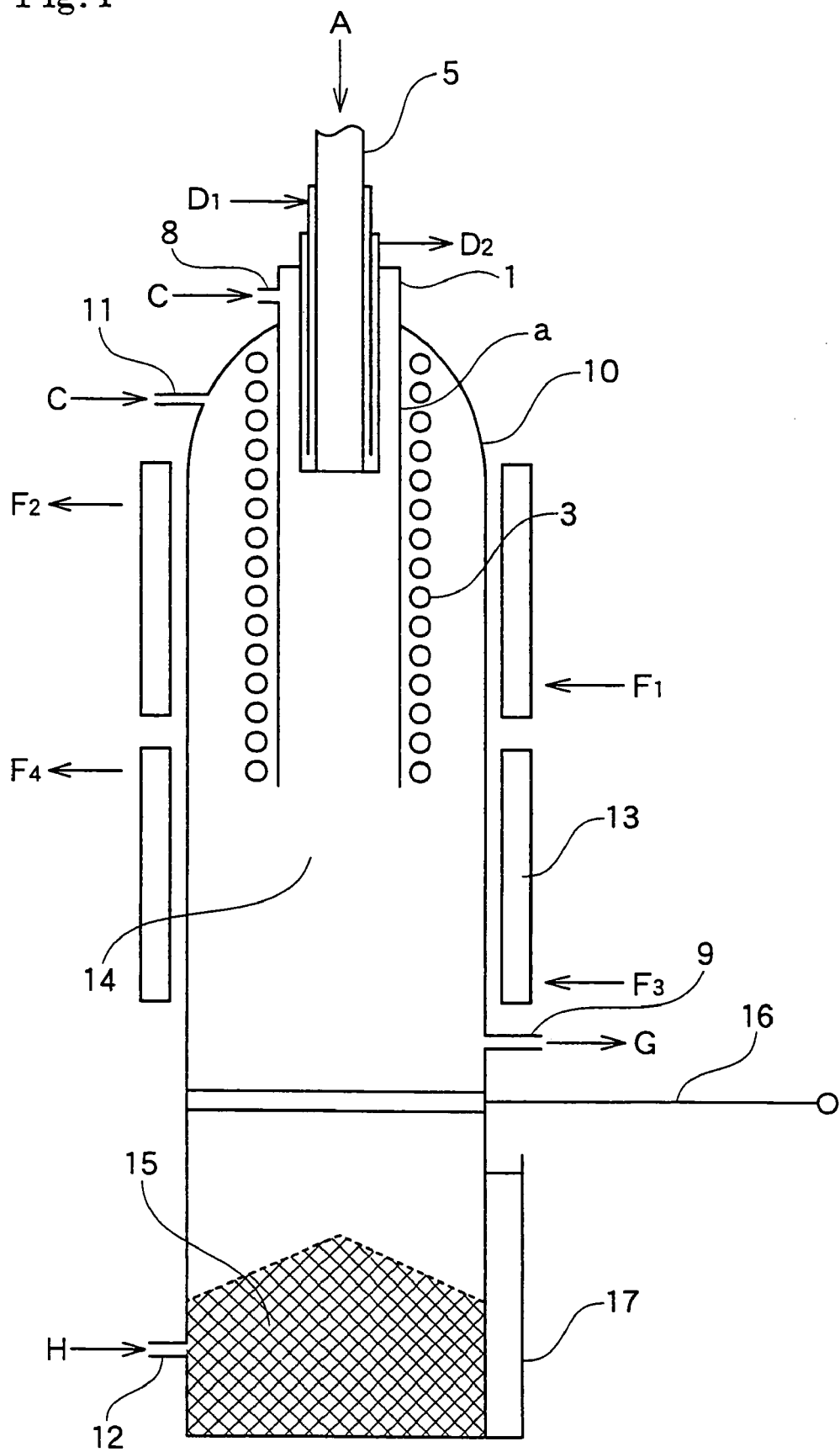
FIG. 4 is a schematic view of portion of a representative practical form of silicon production reactor according to the present invention, which view shows a vertical section of the reactor.
Figure 6:
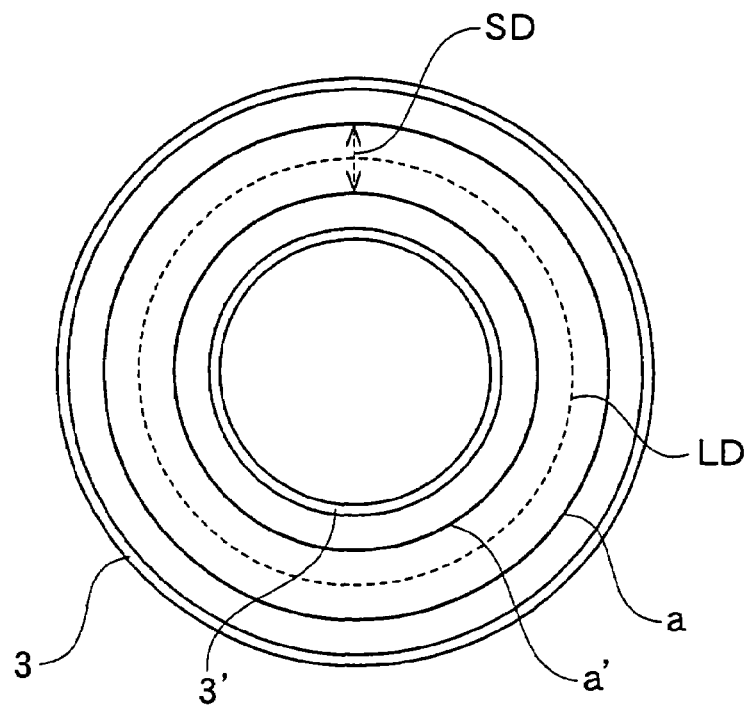
FIG. 6 is a cross-sectional view of another representative space surrounded by a vertically extending wall in a silicon production reactor of the present invention.
Figure 7:
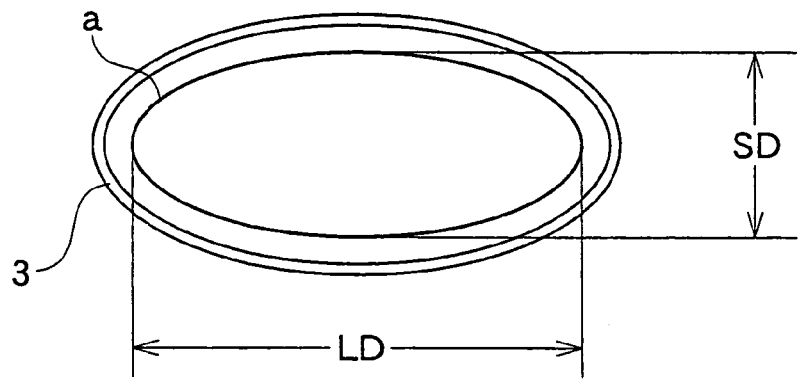
FIG. 7 is a cross-sectional view of a further representative space surrounded by a vertically extending wall in a silicon production reactor of the present invention.
Figure 8:
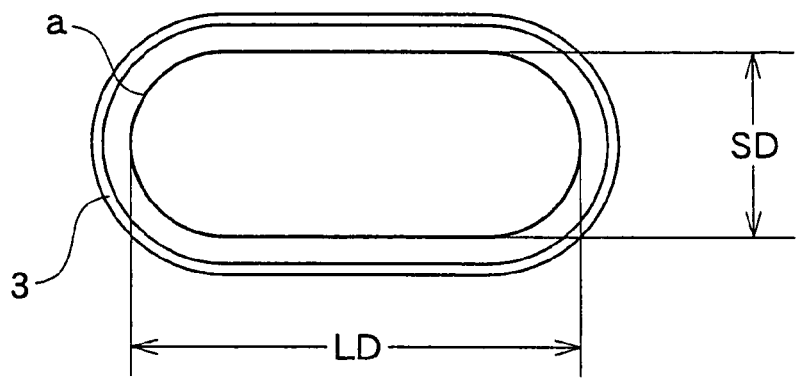
FIG. 8 is a cross-sectional view of still a further representative space surrounded by a vertically extending wall in a silicon production reactor of the present invention.
Figure 9:
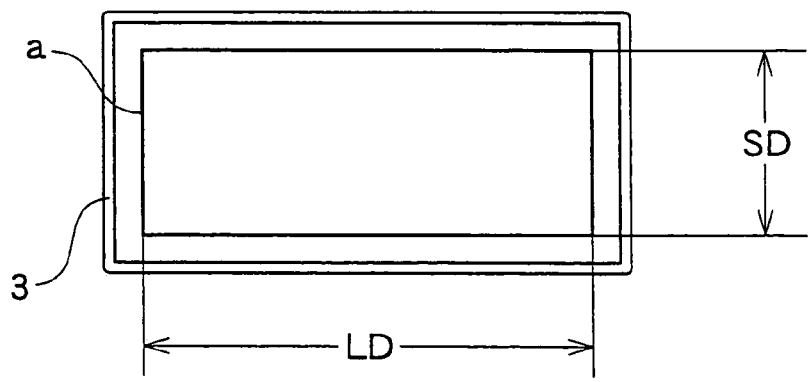
FIG. 9 is a cross-sectional view of yet still a further representative space surrounded by a vertically extending wall in a silicon production reactor of the present invention.

FIGS. 1 to 3 are schematic views of portion of a fundamental form of silicon production reactor according to the present invention. FIG. 4 is a schematic view of a representative practical form of silicon production reactor according to the present invention. (All FIGS. 1 to 3 and FIG. 4 are views showing a vertical section of the reactor.) FIGS. 5 to 9 are cross-sectional views of a space of representative configuration surrounded by a vertically extending wall in a silicon production reactor of the present invention. For example, with respect to the silicon production reactor of FIGS. 1 and 3, configurations of section on the plane (E)-(E') of the drawings are shown in FIGS. 7, 8 and 9. Likewise, with respect to the reactor of FIG. 2, a configuration of section on the plane (E)-(E') of the drawing is shown in FIG. 6.

One form of silicon production reactor according to the present invention will be described referring to FIG. 1. This silicon production reactor is so structured that raw gas for silicon deposition (A) (hereinafter may be referred to as "raw gas") is allowed to flow through space (4) surrounded by vertically extending wall (a) constituting reaction vessel (1), and that silicon deposition/melting is performed on a heated surface of wall (a) facing the space (4) and molten silicon is allowed to fall through bottom opening (2).

In the silicon production reactor of the present invention, it is essentially important that the space (4) of the reaction vessel (1) be of slit form in cross-sectional view.

That is, in the silicon production reactor of the present invention, the space highly apart from the heated surface of wall (a) facing the space (4) is reduced by causing the space (4) of the reaction vessel (1) to be of slit form in cross-sectional view. That is, the distance between the surface of wall (a) and the space where raw gas therein hardly contact with the surface of wall (a) is shortened to thereby enhance the reactivity of raw gas and inhibit the generation of by-products with the result that a striking enhancement of silicon production efficiency can be attained.

The effect exerted by the space (4) of the reaction vessel (1) being of slit form in cross-sectional view according to the present invention (FIGS. 5 to 9) will be described. As compared with a reactor of identical surface area with respect to portion with which raw gas can be brought into contact wherein the space (4) of the reaction vessel (1) in cross-sectional view has width (SD) and length (LD) equal to each other, for example, is circular, regular polygonal or the like, the reactor wherein the space (4) of the reaction vessel (1) in cross-sectional view is of slit form realizes a reduction of the space highly apart from the heated surface of wall (a) facing the space (4). Thus, in the reactor wherein the space (4) of the reaction vessel (1) in cross-sectional view is of slit form, the probability of contact of raw gas with the wall's surface can be enhanced, so that the reactivity of raw gas can be enhanced. Further, as a result of easing of the contact of raw gas with the surface of wall (a), the temperature of raw gas in the space (4) can be satisfactorily raised as a whole to thereby enable narrowing a temperature zone in which by-products are likely to be generated. Consequently, an enhancement of silicon yield can be realized.

Herein, the reactivity of raw gas is defined as the ratio of conversion from the raw gas fed into the space (4) of the reaction vessel (1) to some other substances (including silicon) by the time of the discharge thereof from the space (4). The yield of silicon is defined as the ratio of the raw gas having been converted into silicon to the raw gas having been converted into some other substances (including silicon) through the above reaction.

In the reaction conducted at the same gas feeding rate, when the space (4) of the reaction vessel (1) is of slit form in cross-sectional view, the flow-rate of raw gas is increased and thereby the residence time of raw gas in the space (4) is shortened. However, within the residence time of raw gas described later, the reactivity of raw gas does not decrease despite the shortening of the residence time of raw gas. The reason would be that in the silicon production reactor of the present invention, as compared with the conventional Siemens process, not only can deposition of silicon be accomplished at high surface temperature for deposition but also the raw gas can have its temperature satisfactorily raised and can be activated, so that there can be exerted the effect of conversion to silicon attained within an extremely short period of time upon contact of raw gas with the heated surface of wall (a) facing the space (4).

The effect exerted by the reactor wherein the space (4) of the reaction vessel (1) is of slit form in cross-sectional view according to the present invention will be studied in comparison with a reactor of the same volume wherein the space (4) of the reaction vessel (1) in cross-sectional view has width (SD) and length (LD) equal to each other, for example, is circular, regular polygonal or the like. In the reaction conducted at the same gas feeding rate, the residence time of raw gas in the space (4) would be the same. However, when the space (4) of the reaction vessel (1) is of slit form in cross-sectional, the surface area of portion capable of silicon deposition per gas feeding rate can be enlarged with the result that the reactivity of raw gas can be enhanced and that an effective productivity enhancement can be accomplished without change in the scale of the reactor.

Moreover, in the scaleup of the reactor wherein the space (4) of the reaction vessel (1) is of slit form in cross-sectional view, there can be realized not only the above effects but also the effect of effectively avoiding radiation heat loss at upper and lower end portions of the heated surface of wall (a) facing the space (4) to thereby attain a drastic saving of heating energy. That is, in the use of the silicon production reactor of the present invention, the heated surface of wall (a) facing the space (4) can provide its intervening space narrowed to thereby reduce the area of opening of the reaction vessel. Accordingly, not only can outward radiation loss be drastically reduced but also the temperature drop at upper and lower end portions of the surface can be effectively inhibited with the result that a uniform temperature distribution over reaction zone can be realized with reduced heating energy. This effect is especially striking in embodiments of the present invention carried out at high temperatures of 1000° C. or higher wherein radiant energy is large.

In the present invention, the slit forms include those wherein the slit has a flattened shape or a shape of a ring being continuous in the circumferential direction. The width of the slit form may be constant or inconstant or a combination thereof in the longitudinal direction of the slit form. Examples of the slit forms of constant width include an annular slit form as shown in FIG. 6, a slit form of rectangular shape as shown in FIG. 9 and, not shown, a slit form of C-character shape corresponding to curved rectangular shape. Examples of the slit forms of inconstant width include an elliptic slit form as shown in FIG. 7 and, not shown, rhombic and triangular slit forms. Further, there can be mentioned as a combination thereof a slit form of rectangular having its four corners arc-shaped as shown in FIG. 8. As other slit forms, there can be mentioned a horseshoe-shaped slit form consisting of a combination of rectangles as shown in FIG. 5 and, not shown, L-character shaped, T-character shaped, cross shaped and star shaped slit forms as well as other curved and wave shaped slit forms.

With respect to the determination of width (SD) and length (LD) of slit forms described above, some illustrations are given in FIGS. 5 to 9. The length (LD) of slit generally refers to the largest distance along the longitudinal direction within the slit. On the other hand, the width (SD) of slit is shorter than the length (LD) of the slit and when the slit form has a constant width, the width (SD) refers to the inter-wall distance. When the slit form has an inconstant width (SD) in the longitudinal direction, the width (SD) is defined as the largest length of perpendicular line drawn to a line representing the longitudinal direction (LD line) within the slit. On the other hand, when the slit form is inflected or curved, the length (LD) is defined as the length of straight or curving line which passes through the middle points of segments representing the smallest distance between wall portions opposite to each other.

Figure 5:
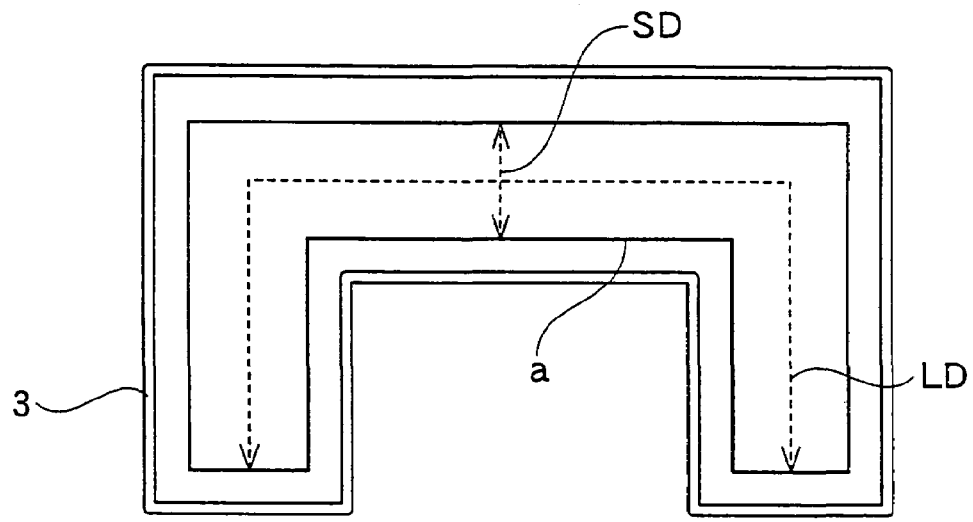
FIG. 5 is a cross-sectional view of a representative space surrounded by a vertically extending wall in a silicon production reactor of the present invention.

For example, in FIG. 5, the width (SD) refers to the inter-wall distance, and the length (LD) refers to the length of horseshoe-shaped line passing through the midpoints of wall portions opposite to each other. Further, in the T-character shaped slit form as well, although not shown, the width (SD) refers to the inter-wall distance, and the length (LD) refers to the length of T-character shaped line passing through the midpoints of wall portions opposite to each other. Same applies to the cross shaped slit form.

In FIG. 6, the width (SD) refers to the distance between inside wall (a') and outside wall (a). The length (LD) refers to the circumference of a circle passing through the midpoints between inside wall (a') and outside wall (a).

In FIG. 8, the width (SD) refers to the largest length of perpendicular line drawn to LD line within the slit. The length (LD) refers to the largest distance along the longitudinal direction.

In FIG. 9, the width (SD) refers to the inter-wall distance. The length (LD) refers to the largest distance along the longitudinal direction.

When the shape in cross-sectional view of the reaction vessel is elliptic as shown in FIG. 7, the width (SD) refers to the minor axis while the length (LD) refers to the major axis.

In the rhombic slit form, although not shown, the width (SD) refers to the smallest length of diagonal line. The length (LD) refers to the largest length of diagonal line. Moreover, in the triangular slit form, the length (LD) refers to the longest side while the width (SD) refers to the distance between the longest side and the angle opposite thereto.

In the silicon production reactor of the present invention, it is preferred that the ratio (LD/SD) of length (LD) to width (SD) of the slit form be 1.5 or higher. When the ratio (LD/SD) is below 1.5, the effect of enhancing the reactivity of raw gas tends to be not conspicuous. On the other hand, the upper limit of ratio (LD/SD), although not particularly restricted, is preferably up to 1000 from the viewpoint of reactor fabrication. With respect to the slit form, taking the above effect and reactor fabrication into account, there can be stated that the ratio (LD/SD) is more preferably in the range of 2 to 400, still more preferably 3 to 300.

The width (SD) of slit form is preferably 0.1 m or less. When the width (SD) exceeds 0.1 m, the effect of enhancing the reactivity of raw gas tends to be not conspicuous. On the other hand, the lower limit of width (SD), although not particularly restricted, is preferably at least 0.005 m from the viewpoint of reactor fabrication. With respect to the slit form, taking the above effect and reactor fabrication into account, the width (SD) is more preferably in the range of 0.01 to 0.08 m, still more preferably 0.01 to 0.06 m.

In connection with the relationship between length (LD) and width (SD) of slit form, it is preferred that the length (LD) of slit form be 0.15 m or greater from the viewpoint of industrial production of silicon. On the other hand, the upper limit of length (LD), although not particularly restricted, is preferably up to 5 m from the viewpoint of reactor fabrication. Taking the quantity of silicon production and reactor fabrication into account, the length (LD) is more preferably in the range of 0.16 to 4 m, still more preferably 0.18 to 3 m.

In the silicon production reactor of the present invention, the configuration in longitudinal sectional view of the space (4) of the reaction vessel (1), although not particularly restricted, can be of cylindrical form as shown in FIGS. 1 to 3 with a view toward easing the fabrication thereof. Alternatively, it can be of form provided with a taper part such that its diameter is gradually decreased toward the opening (2).

With respect to the opening (2) provided at the bottom of the space (4) of the reaction vessel (1), the rim part thereof can be formed so as to be horizontal without any problem in obtaining particulate silicon. The rim part can however also be formed so as to be sloped or waved.

Further, with respect to the configuration of the rim part of the opening (2), when silicon is collected as a melt, the rim part is preferably formed into a blade shape having the thickness gradually decreased toward the front edge in order to ensure satisfactory drainage at the fall of molten silicon from the wall (a).

In the silicon production reactor of the present invention, when the space (4) of the reaction vessel (1) is of form with an inconstant width in longitudinal sectional view as described above, the ratio of length (LD)/width (SD), width (SD) and length (LD) values of the slit form refer to averages thereof over the region wherein the raw gas is brought into contact with the surface of wall (a) facing the space (4) to thereby realize silicon deposition (hereinafter may be referred to as "reaction zone (I)"). That is, the ratio of length (LD)/width (SD), width (SD) and length (LD) values of the slit form refer to averages thereof over the space (4) extending from the uppermost edge to the lowermost edge of the reaction zone (I) shown in FIGS. 1 to 3.

When the raw gas blowoff port (6) is positioned above the uppermost edge of heating means (3) as shown in FIGS. 1 and 2, the position of the uppermost edge of the reaction zone (I) is regarded as agreeing with the position of the uppermost edge of the heating means (3). On the other hand, when the position of the raw gas blowoff port (6) agrees with or is below the position of the uppermost edge of heating means (3) as shown in FIG. 3, the position of the uppermost edge of the reaction zone (I) is regarded as agreeing with the position of the raw gas blowoff port (6).

In the silicon production reactor of the present invention, with respect to the vertically extending wall (a) of the reaction vessel (1), it is essentially important to heat at least a part, including lower end portion, of the surface of wall (a) facing the space (4) to a temperature of not lower than the melting point of silicon. In the surface of wall (a) facing the space (4), the region heated to a temperature of not lower than the melting point of silicon is not particularly limited as long as the lower end portion is included therein, and can be appropriately determined in consideration of the feed rate or speed of the raw gas etc. In this connection, it is satisfactory to take measures for heating the entirety of the wall's surface on which silicon deposition occurs (reaction zone (I)) to a temperature of not lower than the melting point of silicon. Accordingly, it is preferred that the region heated to a temperature of not lower than the melting point of silicon should be 90% or less, especially 80% or less of the whole length of vertically extending wall (a) from the bottom thereof, from the viewpoint that it is easy to prevent silicon scale attachment to the upper part of reaction vessel (1). For ensuring the quantity of silicon produced, the lower limit of the region heated to a temperature of not lower than the melting point of silicon is 20% or more, preferably 30% or more of the whole length of vertically extending wall (a) from the bottom thereof.

In the silicon production reactor of the present invention, the raw gas supply pipe (5) is for flowing of raw gas from an upper part of the space (4) of the reaction vessel (1) toward a lower part thereof. Referring to FIGS. 1 and 2, the position of the raw gas blowoff port (6) of the raw gas supply pipe (5) can be above the uppermost edge of the region heated to a temperature of not lower than the melting point of silicon within the surface of wall (a) facing the space (4), namely, the uppermost edge of the reaction zone (I). Alternatively, referring to FIG. 3, the position of the raw gas blowoff port (6) can be equal to or below the position of the uppermost edge of the reaction zone (I).

In the present invention, when as shown in FIGS. 1 and 2, the position of the raw gas blowoff port (6) of the raw gas supply pipe (5) is above the uppermost edge of the region heated to a temperature of not lower than the melting point of silicon within the surface of wall (a) facing the space (4), namely, the uppermost edge of the reaction zone (I)), the quantity of heat deprived of by the raw gas supply pipe (5) can be reduced to thereby enhance the energy efficiency of heating means (3). In this structure, the method of silicon deposition/melting can be one comprising setting the surface of wall (a) facing the space (4) within the reaction zone (I) at the temperature permitting silicon deposition, thereby performing silicon deposition once and resetting the above surface at the temperature of not lower the melting point of silicon so as to melt the deposited silicon and cause the molten silicon to fall.

In this method of silicon deposition/melting, with respect to means for controlling the heating means (3), it is preferred that the surface of wall (a) facing the space (4) be divided into two sections consisting of upper and lower sections, or more multiple sections so that temperature control can be conducted for individual sections. With respect to particular means for controlling the heating means (3), preferably, the heating means (3) is divided into at least two sections consisting of a first heating means mainly used during silicon deposition reaction and a second heating means for heating area of the surface of wall (a) facing the space (4) which is heated by heat transfer to bring about silicon deposition, each of the first and second heating means being capable of regulation of heat output. Specifically, with respect to the second heating means, the heat output is set at low level or zero during silicon deposition reaction. However, when melting deposited silicon, the heat output is increased to thereby cause silicon to fall. Thus, the growth of silicon scale within the reaction vessel (1) can be prevented.

In this method of silicon deposition/melting, as the method for removing any silicon scale attached to the inside of the reaction vessel (1), there can be employed not only the above method of controlling the heating means (3) but also the method of intermittently feeding an etching gas such as hydrogen chloride so as to remove any attached scale. Also, a combination thereof can be employed.

In the present invention, when the position of the raw gas blowoff port (6) of the raw gas supply pipe (5) is equal to or below the uppermost edge of the reaction zone (I) as shown in FIG. 3, the method of silicon deposition/melting can be one comprising setting the surface of wall (a) facing the space (4) within the reaction zone (I) at the temperature of not lower than the melting point of silicon so as to perform continuous fall of silicon melt. Also, there can be employed the method comprising setting the above surface at the temperature permitting silicon deposition, thereby performing silicon deposition once and resetting the above surface at the temperature of not lower than the melting point of silicon so as to melt the deposited silicon and cause the molten silicon to fall. In these methods, as described later, for preventing undesirable silicon deposition/growth in the interstice between the vertically extending wall (a) and the raw gas supply pipe (5) where is a low-temperature region that silicon may be deposited in solid form, it is preferred to feed a seal gas (seal gas (C), seal gas supply pipe (8)) into the low-temperature region.

In these methods of silicon deposition/melting, the method of controlling heating means (3) can be one comprising controlling the entirety of the wall's surface associated with silicon deposition at the same temperature. Alternatively, the above surface can be divided into two sections consisting of upper and lower sections, or more multiple sections, and temperature control can be performed for each of the sections. The temperature control can be performed by single heating means (3) of the reaction vessel (1), or can be performed by multiple heating means corresponding to each of the multiple sections.

In the silicon production reactor of the present invention, as the heating means (3), common means can be employed without any particular limitation as long as the surface of wall (a) facing the space (4) can be heated thereby to temperature of not lower than the melting point of silicon. It is considered that the melting point of silicon is in the range of 1410 to 1430° C. Specifically, as the heating means, there can be mentioned those capable of heating the surface of wall (a) facing the space (4) with the use of external energy. More specifically, there can be mentioned those utilizing high-frequency heating, heating wire and infrared heating.

Among them, the high-frequency heating means can preferably be used because heating of the surface of wall (a) facing the space (4) to uniform temperature can be easily accomplished with the configuration of high-frequency emitting heating coil simplified.

Further, in the silicon production reactor of the present invention using the high-frequency heating means, a heat insulator can be inserted between the wall (a) and the heating means (3) in order to enhance energy efficiency of heating.

In the silicon production reactor of the present invention, for effectively expanding the surface area of wall (a) associated with silicon deposition relative to the scale of the reactor, it is preferred that the space of the reaction vessel (1) be annular in cross-sectional view as shown in FIG. 6. In this configuration, heating means (3') as shown in FIGS. 2 and 6 can also be provided for satisfactorily heating the surface of inside wall (a') facing the space (4).

As other heating means, there can be employed an embodiment wherein the outside wall (a) is constituted of a 10 mm or less thick carbon-fiber-reinforced carbon composite material while the inside wall (a') is constituted of common isotropic carbon so that both the surfaces of outside wall (a) and the inside wall (a') facing the space can be simultaneously heated by only the outside heating means (3) of high-frequency etc. That is, the carbon-fiber-reinforced carbon composite material constituting the outside wall (a) exhibit higher strength to thereby enable thickness reduction of the wall (a) and exhibit lower electric conductivity as compared with those of common isotropic carbon, so that high-frequency energy from the heating means (3) can appropriately penetrate the wall (a) to thereby enable feeding of satisfactory heating energy to the surface of inside wall (a') facing the space (4).

In the silicon production reactor of the present invention, the configuration of the raw gas supply pipe (5) is not particularly limited, and may be cylindrical or of slit form in cross-sectional view. Further, multiple raw gas supply pipes (5) can be disposed in parallel relationship along the longitudinal direction of the slit form in cross-sectional view of the space (4) of the reaction vessel (1). Especially from the viewpoint of enhancing the uniformity of raw gas dispersed in the space (4), it is preferred that multiple cylindrical raw gas supply pipes are disposed in parallel relationship along the longitudinal direction of the slit form. Alternatively, it is preferred that the shape in cross-sectional view of the raw gas supply pipe be similar to that of the space (4) of the reaction vessel (1).

Moreover, the raw gas supply pipe (5) is preferably equipped with cooling means for cooling the supply pipe for the purpose of preventing the thermal deterioration of the supply pipe and preventing the decomposition of various silanes as raw gas which will be described later. The concrete forms of cooling means (7) are not particularly limited. For example, the cooling means (7) can be a liquid jacket system wherein referring to FIGS. 1 to 3, cooling is effected by disposing such a flow channel that cooling medium such as water or heat medium oil is fed into the interior of the raw gas supply pipe through port (D1) and discharged therefrom through port (D2). Alternatively, the cooling means (7) can be an air cooling jacket system wherein the raw gas supply pipe is equipped with a multi-annular nozzle.

With respect to the cooling temperature for the raw gas supply pipe (5), it is satisfactory to effect cooling to such a temperature that the material constituting the supply pipe would not suffer serious deterioration. Generally, the cooling temperature is set at below the autolysis temperature of fed raw gas.

As the material of the raw gas supply pipe (5), use can be made of not only the same materials as those of vertically extending wall (a) described later but also iron, stainless steel or the like.

One particular form of silicon production reactor according to the present invention will be described below with reference to FIG. 4.

With respect to other structures of the silicon production reactor according to the present invention, common structures such as those described in, for example, Japanese Patent Laid-open Publication No. 2002-29726 can be employed without any particular limitation.

In particular, referring to FIG. 4, the reaction vessel (1) can be installed in sealed vessel (10) having waste gas discharge pipe (9) for waste gas (G) connected thereto, so that not only can silicon of high purity be obtained owing to shutting off air but also waste gas can be efficiently collected. Further, the sealed vessel (10) at its under part may be furnished with a cooling chamber. In this cooling chamber, there is provided a chamber for collecting silicon (15) having fallen from the opening (2). The sealed vessel (10) may be furnished with, in addition to the waste gas discharge pipe (9), cooling jacket (13) capable of causing cooling medium to flow from $F_1$ to $F_2$ and from $F_3$ to $F_4$ and cooling space (14) cooled by the cooling jacket (13). Further, the cooling chamber can be furnished with cooling gas supply pipe (12) to feed cooling gas (H) for cooling obtained silicon (15). The cooling space (14) can be of such a construction that partition board (16) is provided therein so as to collect formed silicon (15) through take-out port (17).

Moreover, as aforementioned, when the position of the raw gas blow-off port (6) of the raw gas supply pipe (5) is equal to or below the position of the uppermost edge of the zone wherein the surface of wall (a) facing the space (4) is heated to temperature of not lower than the melting point of silicon, for preventing the fed raw material from leading to silicon deposition/growth in the interstice between the wall (a) and the raw gas supply pipe (5) at portion of such a low-temperature region that silicon is deposited in solid form, it is preferred to feed a seal gas (seal gas (C), seal gas supply pipe (8)) into the low-temperature region. Any gas not detrimental to the production of silicon can be appropriately used as the seal gas. In particular, inert gases, such as argon and helium, and hydrogen can be appropriately used. When the waste gas is recycled, hydrogen is especially preferred. Moreover, the interstice between the reaction vessel (1) and the sealed vessel (10) is preferably fed with the seal gas from seal gas supply pipe (11) in order to prevent silicon deposition therein.

Furthermore, appropriately mixing a gas capable of etching silicon, such as hydrogen chloride, with the seal gas in order to enhance the effect of seal gas provides a preferred mode.

In the present invention, the vertically extending wall (a) of the reaction vessel (1) is heated to temperature of not lower than the melting point of silicon, and the inside thereof is brought into contact with various silanes and silicon melt. Thus, selecting a material capable of satisfactorily resisting these temperature condition and contact substances is preferred from the viewpoint of performing silicon production stably for a prolonged period of time.

As such a material, there can be mentioned, for example, carbon materials such as graphite, pyrolytic carbon and a carbon-fiber-reinforced carbon composite material, and ceramic materials such as silicon carbide (SiC), silicon nitride ($Si_3N_4$), boron nitride (BN) and aluminum nitride (AlN), which materials are used independently or in combination.

When among these materials a carbon material is used as a base material, it is preferred that at least portion brought into contact with silicon melt be coated with pyrolytic carbon, $Si_3N_4$ or SiC to prevent contamination of deposited silicon.

As the raw gas fed from the raw gas supply pipe (5) in the silicon production reactor of the present invention, there can be mentioned various silanes being used as common silicon raw gases. Specifically, there can be mentioned trichlorosilane (TCS), silicon tetrachloride (STC), monosilane, dichlorosilane, etc. Of these, monosilane and TCS are preferred from the viewpoint that those of high purity are commercially available in large quantity. The raw gas can be used in diluted form. As the diluent gas, like the above seal gas, preferred use is made of gases not detrimental to the production of silicon. In particular, when unreacted raw gas is recycled, it is preferred that the diluent gas be hydrogen and that the ratio of raw gas dilution be such that the raw gas content ranges from 1 to 30 mol %, especially from 3 to 20 mol %. In the use of the diluent gas, the diluent gas may be mixed with the raw gas in advance followed by feeding the resulting mixed gas through the raw gas supply pipe. Alternatively, another supply pipe for diluent gas may be disposed so as to feed the diluent gas therethrough.

In the silicon production reactor of the present invention, the temperature employed for silicon deposition/melting on the surface of wall (a) facing the space (4) can be appropriately determined depending on the composition of fed raw gas, method of silicon deposition/melting, etc. From the viewpoint of stably obtaining silicon of high purity, it is preferred that using TCS as the raw gas, silicon deposition/melting be performed while maintaining the temperature of the wall's surface at 1300 to 1700° C. In the silicon production reactor of the present invention, the effect of the space (4) surrounded by the wall (a) being of slit form in cross-sectional view can be strikingly exerted when the silicon deposition/melting is performed while maintaining the surface of wall (a) facing the space (4) at high temperature such as 1300 to 1700° C.

In the silicon production reactor of the present invention, the pressure for raw gas reaction, although not particularly limited as long as industrial production can be stably performed, is generally in the range of atmospheric pressure to 3 MPaG, preferably atmospheric pressure to 1 MPaG.

In the silicon production reactor of the present invention, although the residence time of each gas can be appropriately regulated depending on the reaction temperature, pressure, etc. in tubular vessel of given capacity, the average residence time is in the range of 0.001 to 60 sec, preferably 0.01 to 10 sec, and still preferably 0.05 to 1 sec. When the residence time is set within the above range, satisfactorily economic reactivity of raw gas can be attained.

The present invention will be described in greater detail below with reference to the following Examples, which however in no way limit the scope of the present invention.

EXAMPLE 1

Use was made of reaction vessel (1) wherein the vertically extending wall (a) was constituted of graphite, the space (4) surrounded by the wall was of flattened form in cross-sectional view as shown in FIG. 8 and the vessel had the configuration of a cylindrical form of 0.1 m SD, 0.16 m LD, 15 mm thickness and 1.0 m length with opening (2) disposed at the bottom thereof. The raw gas supply pipe (5) was constituted of stainless steel, and the cooling means (7) had a jacket structure permitting liquid passage. The raw gas blowoff port (6) used was of 10 mm×100 mm slit form. The raw gas supply pipe (5) was disposed in the reaction vessel (1) so that the center and major diameter direction of the raw gas blowoff port (6) agreed with those of the flattened form of the space (4) and so that the height of the raw gas blowoff port (6) was such that the length of reaction zone (I) of FIG. 3 was 0.6 m. As the heating means (3) for heating the surface of wall (a) facing the space (4) in the reaction zone (I) to temperature of not lower than the melting point of silicon, a heating coil capable of 8 kHz high-frequency emission (heating means) was arranged around the reaction vessel (1) from the position of 0.3 m under the upper end of wall (a) to the position of 0.1 m under the lower end of wall (a). Furthermore, as a heat insulator, a 50 mm thick carbon fiber heat insulating material was arranged so as to surround the reaction vessel (1) and the heating means (3) from the position of 0.2 m under the upper end of wall (a) to the position of 0.03 m above the lower end of wall (a). The sealed vessel (10) was made of stainless steel and had an inside diameter of 1 m and a length of 1.5 m.

The surface of wall (a) facing the space (4) was heated at 1500° C. by high-frequency heating means (3) while cooling the raw gas supply pipe (5) and sealed vessel (10) by water flow and while effecting flow of hydrogen gas from the seal gas supply pipe (8) and seal gas supply pipe (11) simultaneously at a rate of 5 Nm$^3$/H.

Silicon could be stably obtained at a rate of about 1.3 kg/H by feeding trichlorosilane and hydrogen through the raw gas supply pipe (5) at respective rates of 35 kg/H and 100 Nm$^3$/H. The reactivity of trichlorosilane was about 35%. The generation of fine powder silicon was slight and the silicon yield was enhanced. The results are summarized in Table 1.

EXAMPLE 2

Reaction was performed under the same conditions with the use of the same reactor as in Example 1, except that the space (4) surrounded by the vertically extending wall (a) was changed to flattened form of 0.04 m SD and 0.2 m LD in cross-sectional view, that the raw gas blowoff port (6) of the raw gas supply pipe (5) was changed to 10 mm×170 mm slit form and that accordingly the configuration of high-frequency heating coil as the heating means (3) was changed so as to surround the reaction vessel (1) with a 50 mm thick heat insulating material interposed therebetween. The results are summarized in Table 1. The generation of fine powder silicon was extremely slight.

EXAMPLE 3

Reaction was performed under the same conditions with the use of the same reactor as in Example 2 except for the following. The space (4) surrounded by the vertically extending wall (a) was changed to flattened form of 0.04 m SD and 1 m LD in cross-sectional view. Accordingly, the configuration of high-frequency heating coil as the heating means (3) was appropriately changed. The raw gas blowoff port (6) was changed to 10 mm×970 mm slit form. With respect to the sealed vessel (10), the interior thereof was of flattened form in cross-sectional view as shown in FIG. 8, and the minor axis and major axis were changed to 0.5 m and 3 m, respectively. The direction of the flattened form was the same as that of the flattened form of the space (4).

Reaction was performed by effecting flow of hydrogen gas from the seal gas supply pipe (8) and seal gas supply pipe (11) simultaneously at a rate of 25 Nm$^3$/H and feeding trichlorosilane and hydrogen through the raw gas supply pipe (5) at respective rates of 175 kg/H and 500 Nm$^3$/H. The results are summarized in Table 1. The generation of fine powder silicon was extremely slight.

EXAMPLE 4

Use was made of reaction vessel (1) defined as follows. The outside wall (a) was constituted of a carbon-fiber-reinforced carbon composite material and had an inside diameter of 0.25 m and a thickness of 5 mm. The inside wall (a') was constituted of a general-purpose isotropic graphite and had an inside diameter of 0.2 m and a thickness of 15 mm. The space (4) surrounded by the outside wall (a) and inside wall (a') in the reaction vessel (1) was circular in cross-sectional view as shown in FIG. 6. The reaction vessel (1) had the configuration of a cylindrical form of 0.025 m SD, 0.71 m LD and 1.0 m length, having opening (2) disposed at the bottom thereof. The raw gas supply pipe (5), which was constituted of stainless steel and had the cooling means (7) of a jacket structure permitting liquid passage, was arranged so as to cover the entirety of upper part of the reaction vessel (1). The upper end of the inside wall (a') was sealed with a lid of the same material, so that the position of the raw gas blowoff port (6) agreed with the position of the uppermost end of the wall (a) and wall (a') As the heating means (3) for heating portion of the surfaces of the wall (a) and the wall (a') facing the space (4), which are capable of being contacted with raw gas, to temperature of not lower than the melting point of silicon, a heating coil capable of 1 kHz high-frequency emission was arranged around the outside wall (a) from the position of 0.15 m under the upper end of wall (a) to the position of 0.1 m under the lower end of wall (a). Furthermore, a 50 mm thick carbon fiber heat insulating material was arranged between the heating coil and the outside wall (a) from the uppermost end of outside wall (a) to the position of 0.03 m above the lower end of outside wall (a) as well as over the upper end part lid sealing the inside wall (a'). The sealed vessel (10) was made of stainless steel, having an inside diameter of 1 m and a length of 1.5 m.

The surfaces of the wall (a) and the wall (a') facing the space (4) were heated at 1300° to 1400° C. by high-frequency heating means (3) while cooling the raw gas supply pipe (5) and sealed vessel (10) by water flow.

Reaction was performed by feeding trichlorosilane and hydrogen through the raw gas supply pipe (5) at respective rates of 175 kg/H and 500 Nm$^3$/H. The operation of feeding the raw gas at the above feeding rate for 2 hr and thereafter reducing the feeding rate of raw gas to ⅓ for 15 min was repeated. At the time of reduction of gas feeding rate, silicon was melted and fell. The results are summarized in Table 1. The generation of fine powder silicon was extremely slight.

COMPARATIVE EXAMPLE 1

Reaction was performed under the same conditions with the use of the same reactor as in Example 1 except for the following. The space (4) surrounded by the vertically extending wall (a) was of circular form of 0.15 m inside diameter in cross-sectional view. The length of the reaction zone (I) was 0.6 m. The raw gas blowoff port was also of circular form of 40 mm. Further, accordingly, the configuration of high-frequency heating coil as the heating means (3) was changed so as to surround the reaction vessel with a 50 mm thick heat insulating material interposed therebetween. The results are summarized in Table 1. The generation of fine powder silicon abounded to some extent.

COMPARATIVE EXAMPLE 2

Reaction was performed under the same conditions with the use of the same reactor as in Example 3 except for the following. The space (4) surrounded by the vertically extending wall (a) was of circular form of 0.23 m inside diameter in cross-sectional view. The length of the reaction zone (I) was 0.6 m. The raw gas blowoff port was also of circular form of 60 mm. Further, accordingly, the configuration of high-frequency heating coil as the heating means (3) was changed so as to surround the reaction vessel with a 50 mm thick heat insulating material interposed therebetween. The results are summarized in Table 1. The generation of fine powder silicon abounded to some extent.

Referring to Table 1, it is apparent from comparison between Examples 1-2 and Comparative Example 1 that when the surface areas of portion associated with silicon formation in the reaction vessel are nearly equal to each other, not only is the reactivity of raw gas high but also the unfavorable generation of fine powder can be reduced to result in high silicon yield despite the short residence time of raw gas in Examples 1-2.

Further, it is apparent from comparison between Example 3 and Comparative Example 2 that when in the reaction vessel not only the volumes but also the gas residence times are nearly equal to each other, the reactivity of raw gas is so high that the quantity of silicon produced can be increased to a large extent in Example 3.

The use of the silicon production reactor of the present invention, even when scaleup of the reaction vessel is effected, has realized maintaining of a high reactivity of raw gas and strikingly efficient increasing of a quantity of silicon produced.

As apparent from the above description, the silicon production reactor of the present invention, even when scale-up of the reactor is effected, has realized an enhancement of raw gas reactivity and further a maintaining of high silicon yield through suppression of by-product formation with the result that the continuous production efficiency has been enhanced to a striking extent for a prolonged period of time. Moreover, the silicon production reactor has realized an effective prevention of radiant heat loss at both ends of the space surrounded by the vertically extending wall.

The invention claimed is:

1. A silicon production reactor comprising a reaction vessel and heating means, said reaction vessel comprising a vertically extending wall and a space surrounded by the wall, wherein the space of the reaction vessel is of slit form in cross-sectional view, said heating means being capable of heating a part, which is 90% or less of the whole length of the vertically extending wall from the bottom thereof, of the wall's surface facing the space to a temperature of not lower than the melting point of silicon, said heating means being divided into at least two sections comprised of a first heating means and a second heating means so that said heating means can control the temperature of the wall's surface facing the space in two or more divided sections comprised of upper and lower sections, or more multiple sections, and,

TABLE 1

| | SD [m] | LD [m] | LD/SD | Length of reaction zone I [m] | Reaction surface area* [m$^2$] | Reaction volume** [m$^3$] | Rate of feed*** [Nm$^3$/H] | Residence time of gas [S] | Reactivity of TCS [%] | Silicon yield**** [mol %] | Quantity of silicon produced [kg/H] |
|---|---|---|---|---|---|---|---|---|---|---|---|
| Example 1 | 0.10 | 0.16 | 1.6 | 0.6 | 0.26 | 0.008 | 106 | 0.28 | 35 | 51 | 0.9 |
| Example 2 | 0.04 | 0.2 | 5 | 0.6 | 0.27 | 0.005 | 106 | 0.16 | 55 | 52 | 2.1 |
| Example 3 | 0.04 | 1.00 | 25 | 0.6 | 1.23 | 0.024 | 529 | 0.16 | 53 | 53 | 10 |
| Example 4 | 0.025 | 0.71 | 28.4 | 0.85 | 1.20 | 0.015 | 529 | 0.10 | 45 | 60 | 9.8 |
| Comp. Ex. 1 | 0.15 | 0.15 | 1 | 0.6 | 0.28 | 0.011 | 106 | 0.36 | 22 | 48 | 0.8 |
| Comp. Ex. 2 | 0.23 | 0.23 | 1 | 0.6 | 0.43 | 0.025 | 529 | 0.17 | 20 | 48 | 0.7 |

*Inside surface area of vertically extending wall within reaction zone I
**Vol. of space surrounded by vertically extending wall within reaction zone I
***Rate of feed of total of TCS and hydrogen
****Ratio of TCS converted into silicon to reacted TCS said silicon production reactor being adapted to flow raw gas for silicon deposition from an upper part of the space of the reaction vessel toward a lower part thereof.

2. The silicon production reactor as claimed in claim 1, wherein the slit form has a ratio (LD/SD) of length (LD) to width (SD) of 1.5 or more.

3. The silicon production reactor as claimed in claim 1, wherein the width (SD) of the slit form is 0.1 m or less.

4. The silicon production reactor as claimed in claim 1,
wherein the vertically extending wall is constituted of a material capable of being heated by high-frequency application,
wherein a high-frequency generation coil is arranged around the vertically extending wall so as to enable heating of the vertically extending wall.

5. The silicon production reactor as claimed in claim 2, wherein the width (SD) of the slit form is 0.1 m or less.

6. The silicon production reactor as claimed in claim 2,
wherein the vertically extending wall is constituted of a material capable of being heated by high-frequency application,
wherein a high-frequency generation coil is arranged around the vertically extending wall so as to enable heating of the vertically extending wall.

7. The silicon production reactor as claimed in claim 3,
wherein the vertically extending wall is constituted of a material capable of being heated by high-frequency application,
wherein a high-frequency generation coil is arranged around the vertically extending wall so as to enable heating of the vertically extending wall.

* * * * *